United States Patent
Huang et al.

(10) Patent No.: US 8,461,015 B2
(45) Date of Patent: Jun. 11, 2013

(54) STI STRUCTURE AND METHOD OF FORMING BOTTOM VOID IN SAME

(75) Inventors: Yu-Lien Huang, Jhubei (TW); Han-Pin Chung, Fongshan (TW); Shiang-Bau Wang, Pingzchen (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 307 days.

(21) Appl. No.: 12/757,203

(22) Filed: Apr. 9, 2010

(65) Prior Publication Data

US 2011/0006390 A1    Jan. 13, 2011

Related U.S. Application Data

(60) Provisional application No. 61/223,928, filed on Jul. 8, 2009.

(51) Int. Cl.
  *H01L 21/76* (2006.01)
  *H01L 21/469* (2006.01)
(52) U.S. Cl.
  USPC ........... 438/422; 438/421; 438/424; 438/435; 438/787; 257/E21.546
(58) Field of Classification Search
  USPC ... 438/421, 422, 424, 435, 787; 257/E21.546
  See application file for complete search history.

(56) References Cited

U.S. PATENT DOCUMENTS

| | | | |
|---|---|---|---|
| 5,581,202 A | 12/1996 | Yano et al. | |
| 5,658,417 A | 8/1997 | Watanabe et al. | |
| 5,767,732 A | 6/1998 | Lee et al. | |
| 5,963,789 A | 10/1999 | Tsuchiaki | |
| 6,065,481 A | 5/2000 | Fayfield et al. | |

(Continued)

FOREIGN PATENT DOCUMENTS

| CN | 1945829 | 4/2004 |
|---|---|---|
| CN | 101179046 | 5/2005 |

(Continued)

OTHER PUBLICATIONS

Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.

(Continued)

*Primary Examiner* — Ha Tran T Nguyen
*Assistant Examiner* — Aaron Dehne
(74) *Attorney, Agent, or Firm* — Lowe Hauptman Ham & Berner, LLP

(57) ABSTRACT

A method for forming an STI structure is provided. In one embodiment, a trench is formed in a substrate, the trench having a first sidewall and a second sidewall opposite the first sidewall, the sidewalls extending down to a bottom portion of the trench. An insulating material is deposited to line the surfaces of the sidewalls and the bottom portion. The insulating material proximate the top portions and the bottom portion of the trench are thereafter etched back. The insulating material is deposited to line the inside surfaces of the trench at a rate sufficient to allow a first protruding insulating material deposited on the first sidewall and a second protruding insulating material deposited on the second sidewall to approach theretogether. The steps of etching back and depositing are repeated to have the first and second protruding materials abut, thereby forming a void near the bottom of the trench.

20 Claims, 3 Drawing Sheets

U.S. PATENT DOCUMENTS

| | | | |
|---|---|---|---|
| 6,121,786 A | 9/2000 | Yamagami et al. | |
| 6,299,724 B1 | 10/2001 | Fayfield et al. | |
| 6,503,794 B1 | 1/2003 | Watanabe et al. | |
| 6,613,634 B2 | 9/2003 | Ootsuka et al. | |
| 6,622,738 B2 | 9/2003 | Scovell | |
| 6,642,090 B1 | 11/2003 | Fried et al. | |
| 6,706,571 B1 | 3/2004 | Yu et al. | |
| 6,713,365 B2 * | 3/2004 | Lin et al. | 438/424 |
| 6,727,557 B2 | 4/2004 | Takao | |
| 6,740,247 B1 | 5/2004 | Han et al. | |
| 6,743,673 B2 | 6/2004 | Watanabe et al. | |
| 6,762,448 B1 | 7/2004 | Lin et al. | |
| 6,791,155 B1 * | 9/2004 | Lo et al. | 257/506 |
| 6,828,646 B2 | 12/2004 | Marty et al. | |
| 6,830,994 B2 | 12/2004 | Mitsuki et al. | |
| 6,858,478 B2 | 2/2005 | Chau et al. | |
| 6,872,647 B1 | 3/2005 | Yu et al. | |
| 6,940,747 B1 | 9/2005 | Sharma et al. | |
| 6,949,768 B1 | 9/2005 | Anderson et al. | |
| 6,964,832 B2 | 11/2005 | Moniwa et al. | |
| 7,009,273 B2 | 3/2006 | Inoh et al. | |
| 7,018,901 B1 | 3/2006 | Thean et al. | |
| 7,026,232 B1 | 4/2006 | Koontz et al. | |
| 7,067,400 B2 | 6/2006 | Bedell et al. | |
| 7,078,312 B1 * | 7/2006 | Sutanto et al. | 438/424 |
| 7,084,079 B2 | 8/2006 | Conti et al. | |
| 7,084,506 B2 | 8/2006 | Takao | |
| 7,112,495 B2 | 9/2006 | Ko et al. | |
| 7,153,744 B2 | 12/2006 | Chen et al. | |
| 7,157,351 B2 | 1/2007 | Cheng et al. | |
| 7,190,050 B2 | 3/2007 | King et al. | |
| 7,193,399 B2 | 3/2007 | Aikawa | |
| 7,247,887 B2 | 7/2007 | King et al. | |
| 7,265,008 B2 | 9/2007 | King et al. | |
| 7,265,418 B2 | 9/2007 | Yun et al. | |
| 7,297,600 B2 | 11/2007 | Oh et al. | |
| 7,300,837 B2 | 11/2007 | Chen et al. | |
| 7,315,994 B2 | 1/2008 | Aller et al. | |
| 7,323,375 B2 | 1/2008 | Yoon et al. | |
| 7,338,614 B2 | 3/2008 | Martin et al. | |
| 7,351,622 B2 | 4/2008 | Buh et al. | |
| 7,358,166 B2 | 4/2008 | Agnello et al. | |
| 7,361,563 B2 | 4/2008 | Shin et al. | |
| 7,374,986 B2 | 5/2008 | Kim et al. | |
| 7,394,116 B2 | 7/2008 | Kim et al. | |
| 7,396,710 B2 | 7/2008 | Okuno | |
| 7,407,847 B2 | 8/2008 | Doyle et al. | |
| 7,410,844 B2 | 8/2008 | Li et al. | |
| 7,425,740 B2 | 9/2008 | Liu et al. | |
| 7,442,967 B2 | 10/2008 | Ko et al. | |
| 7,456,087 B2 | 11/2008 | Cheng | |
| 7,494,862 B2 | 2/2009 | Doyle et al. | |
| 7,508,031 B2 | 3/2009 | Liu et al. | |
| 7,528,465 B2 | 5/2009 | King et al. | |
| 7,534,689 B2 | 5/2009 | Pal et al. | |
| 7,538,387 B2 | 5/2009 | Tsai | |
| 7,550,332 B2 | 6/2009 | Yang | |
| 7,598,145 B2 | 10/2009 | Damlencourt et al. | |
| 7,605,449 B2 | 10/2009 | Liu et al. | |
| 7,682,911 B2 | 3/2010 | Jang et al. | |
| 7,759,228 B2 | 7/2010 | Sugiyama et al. | |
| 7,795,097 B2 | 9/2010 | Pas | |
| 7,798,332 B1 | 9/2010 | Brunet | |
| 7,820,513 B2 | 10/2010 | Hareland et al. | |
| 7,851,865 B2 | 12/2010 | Anderson et al. | |
| 7,868,317 B2 | 1/2011 | Yu et al. | |
| 7,898,041 B2 | 3/2011 | Radosavljevic et al. | |
| 7,923,321 B2 | 4/2011 | Lai et al. | |
| 7,923,339 B2 | 4/2011 | Meunier-Beillard et al. | |
| 7,960,791 B2 | 6/2011 | Anderson et al. | |
| 7,985,633 B2 | 7/2011 | Cai et al. | |
| 7,989,846 B2 | 8/2011 | Furuta | |
| 7,989,855 B2 | 8/2011 | Narihiro | |
| 8,003,466 B2 | 8/2011 | Shi et al. | |
| 8,043,920 B2 | 10/2011 | Chan et al. | |
| 8,076,189 B2 | 12/2011 | Grant | |
| 8,101,475 B2 | 1/2012 | Oh et al. | |
| 2003/0080361 A1 | 5/2003 | Murthy et al. | |
| 2003/0109086 A1 | 6/2003 | Arao | |
| 2003/0234422 A1 | 12/2003 | Wang et al. | |
| 2004/0075121 A1 | 4/2004 | Yu et al. | |
| 2004/0129998 A1 | 7/2004 | Inoh et al. | |
| 2004/0192067 A1 | 9/2004 | Ghyselen et al. | |
| 2004/0219722 A1 | 11/2004 | Pham et al. | |
| 2004/0259315 A1 | 12/2004 | Sakaguchi et al. | |
| 2005/0020020 A1 | 1/2005 | Collaert et al. | |
| 2005/0051865 A1 * | 3/2005 | Lee et al. | 257/506 |
| 2005/0082616 A1 | 4/2005 | Chen et al. | |
| 2005/0153490 A1 | 7/2005 | Yoon et al. | |
| 2005/0170593 A1 | 8/2005 | Kang et al. | |
| 2005/0212080 A1 | 9/2005 | Wu et al. | |
| 2005/0221591 A1 | 10/2005 | Bedell et al. | |
| 2005/0224800 A1 | 10/2005 | Lindert et al. | |
| 2005/0233598 A1 | 10/2005 | Jung et al. | |
| 2005/0266698 A1 | 12/2005 | Cooney et al. | |
| 2005/0280102 A1 | 12/2005 | Oh et al. | |
| 2006/0038230 A1 | 2/2006 | Ueno et al. | |
| 2006/0068553 A1 | 3/2006 | Thean et al. | |
| 2006/0091481 A1 | 5/2006 | Li et al. | |
| 2006/0091482 A1 | 5/2006 | Kim et al. | |
| 2006/0091937 A1 | 5/2006 | Do | |
| 2006/0105557 A1 | 5/2006 | Klee et al. | |
| 2006/0128071 A1 | 6/2006 | Rankin et al. | |
| 2006/0138572 A1 | 6/2006 | Arikado et al. | |
| 2006/0151808 A1 | 7/2006 | Chen et al. | |
| 2006/0153995 A1 | 7/2006 | Narwankar et al. | |
| 2006/0166475 A1 | 7/2006 | Mantl | |
| 2006/0214212 A1 | 9/2006 | Horita et al. | |
| 2006/0258156 A1 | 11/2006 | Kittl | |
| 2007/0001173 A1 | 1/2007 | Brask et al. | |
| 2007/0004218 A1 | 1/2007 | Lee et al. | |
| 2007/0015334 A1 | 1/2007 | Kittl et al. | |
| 2007/0020827 A1 | 1/2007 | Buh et al. | |
| 2007/0024349 A1 | 2/2007 | Tsukude | |
| 2007/0029576 A1 | 2/2007 | Nowak et al. | |
| 2007/0048907 A1 | 3/2007 | Lee et al. | |
| 2007/0076477 A1 | 4/2007 | Hwang et al. | |
| 2007/0093010 A1 | 4/2007 | Mathew et al. | |
| 2007/0093036 A1 | 4/2007 | Cheng et al. | |
| 2007/0096148 A1 | 5/2007 | Hoentschel et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0145487 A1 | 6/2007 | Kavalieros et al. | |
| 2007/0152276 A1 | 7/2007 | Arnold et al. | |
| 2007/0166929 A1 | 7/2007 | Matsumoto et al. | |
| 2007/0178637 A1 | 8/2007 | Jung et al. | |
| 2007/0221956 A1 | 9/2007 | Inaba | |
| 2007/0236278 A1 | 10/2007 | Hur et al. | |
| 2007/0241414 A1 | 10/2007 | Narihiro | |
| 2007/0247906 A1 | 10/2007 | Watanabe et al. | |
| 2007/0254440 A1 | 11/2007 | Daval | |
| 2008/0001171 A1 | 1/2008 | Tezuka et al. | |
| 2008/0036001 A1 | 2/2008 | Yun et al. | |
| 2008/0042209 A1 | 2/2008 | Tan et al. | |
| 2008/0050882 A1 | 2/2008 | Bevan et al. | |
| 2008/0085580 A1 | 4/2008 | Doyle et al. | |
| 2008/0085590 A1 | 4/2008 | Yao et al. | |
| 2008/0095954 A1 | 4/2008 | Gabelnick et al. | |
| 2008/0102586 A1 | 5/2008 | Park | |
| 2008/0124878 A1 | 5/2008 | Cook et al. | |
| 2008/0227241 A1 | 9/2008 | Nakabayashi et al. | |
| 2008/0265344 A1 | 10/2008 | Mehrad et al. | |
| 2008/0290470 A1 | 11/2008 | King et al. | |
| 2008/0296632 A1 | 12/2008 | Moroz et al. | |
| 2008/0318392 A1 * | 12/2008 | Hung et al. | 438/435 |
| 2009/0026540 A1 | 1/2009 | Sasaki et al. | |
| 2009/0039388 A1 | 2/2009 | Teo et al. | |
| 2009/0066763 A1 | 3/2009 | Fujii et al. | |
| 2009/0155969 A1 | 6/2009 | Chakravarti et al. | |
| 2009/0166625 A1 | 7/2009 | Ting et al. | |
| 2009/0181477 A1 | 7/2009 | King et al. | |
| 2009/0200612 A1 | 8/2009 | Koldiaev | |
| 2009/0239347 A1 | 9/2009 | Ting et al. | |
| 2009/0321836 A1 | 12/2009 | Wei et al. | |

| | | | |
|---|---|---|---|
| 2010/0155790 A1 | 6/2010 | Lin et al. | |
| 2010/0163926 A1 | 7/2010 | Hudait et al. | |
| 2010/0187613 A1 | 7/2010 | Colombo et al. | |
| 2010/0207211 A1 | 8/2010 | Sasaki et al. | |
| 2010/0308379 A1 | 12/2010 | Kuan et al. | |
| 2011/0018065 A1 | 1/2011 | Curatola et al. | |
| 2011/0108920 A1 | 5/2011 | Basker et al. | |
| 2011/0129990 A1 | 6/2011 | Mandrekar et al. | |
| 2011/0195555 A1 | 8/2011 | Tsai et al. | |
| 2011/0195570 A1 | 8/2011 | Lin et al. | |
| 2011/0256682 A1 | 10/2011 | Yu et al. | |
| 2012/0086053 A1 | 4/2012 | Tseng et al. | |

FOREIGN PATENT DOCUMENTS

| | | |
|---|---|---|
| CN | 1011459116 | 6/2009 |
| JP | 2007-194336 | 8/2007 |
| KR | 10-2005-0119424 | 12/2005 |
| KR | 1020070064231 | 6/2007 |
| TW | 497253 | 8/2002 |
| WO | WO2007/115585 | 10/2007 |

OTHER PUBLICATIONS

Shikida, Mitsuhiro, et al., "Comparison of Anisotropic Etching Properties Between KOH and TMAH Solutions", IEEE Xplore, Jun. 30, 2010, pp. 315-320.

Anathan, Hari, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.

Quirk et al., Semiconductor Manufacturing Technology, Oct. 2001, Prentice Hall, Chapter 16.

McVittie, James P., et al., "SPEEDIE: A Profile Simulator for Etching and Deposition", Proc. SPIE 1392, 126 (1991).

90 nm Technology. retrieved from the internet <URL:http://tsmc.com/english/dedicatedFoundry/technology/90nm.htm.

Merriam Webster definition of substantially retrieved from the internet <URL:http://www.merriam-webster.com/dictionary/substantial>.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

* cited by examiner

STI STRUCTURE AND METHOD OF FORMING BOTTOM VOID IN SAME

CROSS-REFERENCE TO RELATED APPLICATIONS

The present application claims priority of U.S. Application Ser. No. 61/223,928, filed on Jul. 8, 2009, which is incorporated herein by reference in its entirety.

TECHNICAL FIELD

The present application is related to U.S. patent application Ser. Nos. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

BACKGROUND

Gaps and trenches such as those found in shallow isolation (STI) structures are commonly employed to electrically isolate elements on semiconductor devices. An STI structure may include a trench or gap formed in an isolation region of a semiconductor substrate that is filled with a dielectric material to hinder the electrical coupling of nearby device structures (e.g., transistors, diodes, etc.). As the device density on integrated circuits continues to increase, the size and distance between device structures continue to decrease. However, the vertical heights of the STI trenches normally do not decrease as fast as their horizontal widths, resulting in gaps and trenches with larger ratios of height to width (e.g., higher aspect ratios).

While the ability to make device structures with increasing aspect ratios allows more of the structures (e.g., transistors, capacitors, diodes, etc.) to be packed onto the same surface area of a semiconductor chip substrate, it has also created fabrication problems. One of these problems is the difficulty of completely filling the gaps and trenches in these structures without creating a random void or seam during the filling process. Filling gaps and trenches with dielectric materials like silicon oxide is necessary to electrically isolate nearby device structures from each other to minimize electrical noise and current leakage. As aspect ratios increase, it becomes more difficult to fill deep narrow trenches without creating a void or seam in the dielectric material that fills the trench.

However, from an STI deposition process and isolation performance point of view, voids formed near the bottom of the trench may be acceptable and can have the benefit of good isolation since air has a dielectric constant, k value of only 1. However, current processes in forming voids near the bottom of the trenches may be problematic. The sizes, shapes, locations, and densities of the voids formed may not all be consistent. This could result in unpredictable and inconsistent post-deposition processing of the dielectric layer, such as non-uniform etching, polishing, annealing, etc. The voids formed in the finished devices may also create variations in the dielectric qualities of the gaps and trenches in device structures. This can result in erratic and inferior device performance due to electrical crosstalk, charge leakage, and in some instances, shorting within the device, among other problems.

For these reasons and other reasons that will become apparent upon reading the following detailed description, there is a need for an improved process of forming bottom voids in trenches and gaps that avoids the problems associated with conventional processes.

BRIEF DESCRIPTION OF DRAWINGS

The features, aspects, and advantages of the present disclosure will become more fully apparent from the following detailed description, appended claims, and accompanying drawings in which:

DETAILED DESCRIPTION

In the following description, numerous specific details are set forth to provide a thorough understanding of the embodiments of the present disclosure. However, one having an ordinary skill in the art will recognize that the embodiments of the disclosure can be practiced without these specific details. In some instances, well-known structures and processes have not been described in detail to avoid unnecessarily obscuring the embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

While the present disclosure is particularly directed to the formation of STI features, it is to be understood that the teachings of the disclosure may be applied to the filling of other types of gaps or openings in other integrated circuit manufacturing processes. Further, the present disclosure is directed to substrates having trenches, gaps, etc., with high height to width aspect ratios (e.g., an aspect ratio of 5:1 or more, 6:1 or more, 7:1 or more, 8:1 or more, 9:1 or more, 10:1 or more, 11:1 or more, 12:1 or more, etc.).

FIGS. 1-6 are simplified exemplary cross-sectional views of a semiconductor device depicted at various stages of forming an STI structure, according to some embodiments of the present disclosure. These diagrams are merely examples, and are not intended to restrict the scope of invention to only what is illustrated. One of ordinary skill in the art would recognize other variations, modifications, and alternatives.

Figure 1:
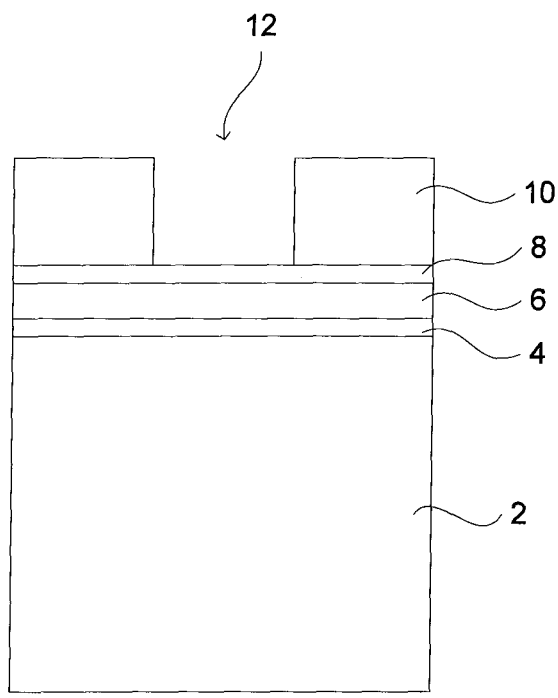
FIGS. 1-6 are cross-sectional views of a semiconductor device at various stages of forming an STI structure, according to an embodiment of the present disclosure.

FIG. 1 shows a semiconductor substrate 2 according to an exemplary embodiment of the present disclosure. The substrate 2 may be a semiconductor process wafer (e.g., a 200 mm, 300 mm, 400 mm, etc. silicon wafer) and may include structures, device components, etc., formed in earlier processes. The substrate 2 may be a single crystalline or polycrystalline silicon substrate. It will be appreciated that the substrate 2 may include epi silicon layer, buried layers, silicon on insulator (SOI), SiGe, or GaAs. A pad oxide layer 4 of $SiO_2$ having a thickness of about 50 Angstroms to about 150 Angstroms, for example may be thermally grown by conventional processes or formed by LPCVD TEOS over the substrate 2 to aid in reducing surface stresses induced in subsequent processing steps. A silicon nitride (e.g., $Si_3N_4$) layer 6 is then deposited by a conventional CVD method, for example LPCVD, to a thickness of about 500 Angstroms to about 2,000 Angstroms. Silicon nitride layer 6 serves as a hardmask, which protects active regions during a subsequent STI oxide deposition process and as a polish stop material during a subsequent chemical mechanical planarization (CMP) step.

A second hardmask layer 8 may optionally be added as a hardmask for a subsequent dry etch process formed, for example of PECVD SiON, PECVD $SiO_2$, or LPCVD TEOS. The second hardmask layer 8 may be formed over the silicon nitride layer 6 to a thickness of about 150 Angstroms to about 500 Angstroms. In addition, an organic or inorganic anti-reflective coating (ARC) layer may be formed over the silicon nitride layer 6 or the second hardmask layer 8, if present, to a thickness of about 200 Angstroms to about 1,000 Angstroms, depending on the wavelength of light to be used in the photolithographic process.

Still referring to FIG. 1, a photoresist layer 10 having a thickness of about 1,000 Angstroms to 6,000 Angstroms, for example is then deposited over the second hardmask layer 8 and photographically patterned to form an opening 12 exposing a portion of the second hardmask layer 8 for dry etching through a thickness portion of the second and SiN hardmask layers, e.g., 8 and 6 respectively, to form a dry etching hardmask.

Figure 2:
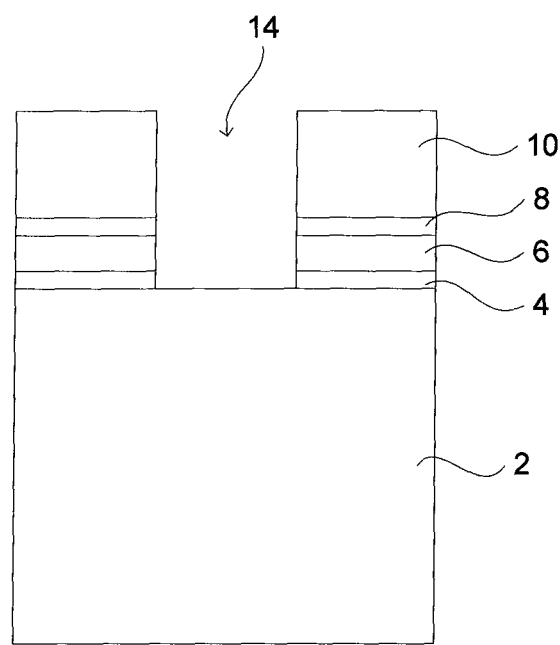

Referring to FIG. 2, the second hardmask layer 8 and the silicon nitride layer 6 are then etched according to the patterned photoresist layer opening 12 by conventional process to expose a portion of the substrate 2 to form hardmask opening 14 according to conventional reactive ion etch (RIE) process, for example including a fluorocarbon etching chemistry, such as for example, $CF_4$. For example, the silicon nitride layer 6 is anisotropically dry etched through a thickness to include the pad oxide layer 4 to expose a surface portion of the substrate 2 according to endpoint detection.

Figure 3:
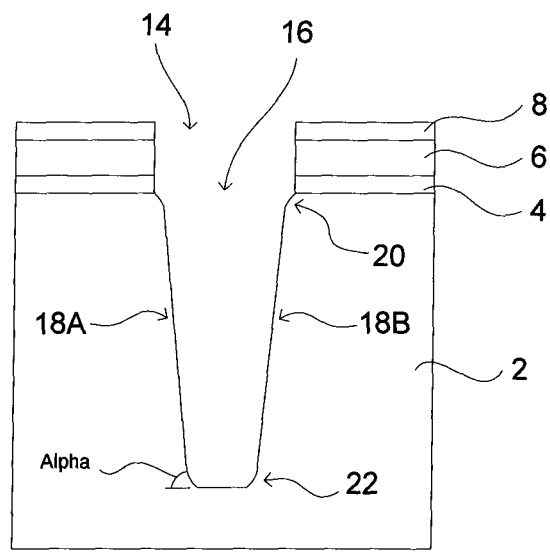

Referring now to FIG. 3, in one aspect of the method of the present disclosure, following removal of the photoresist layer 10, for example, by a wet stripping or dry ashing process, an STI trench 16 is then dry etched into the silicon substrate to a depth between about 100 Angstroms and about 5,000 Angstroms, in one aspect forming a first sloped sidewall 18A and a second sloped sidewall 18B, the two sidewalls 18A and 18B extending down to a bottom portion of the trench 16. First sloped sidewall 18A, for example has an angle, alpha, with respect to the plane of the major surface (process surface) of the substrate, in one aspect between about 80 and 89 degrees with the upper portion of the trench being wider than the bottom portion. A conventional etching chemistry, including for example, $Cl_2$, HBR, and $O_2$ is used to dry etch the trench 16 unto the substrate 2 to form a shallow trench isolation (STI) opening (trench opening) 16. In one embodiment of the present disclosure, during the trench etching process, trench top portion corners, for example 20 and trench bottom portion corners, for example 22 are formed such that the trench opening corners at the top and/or bottom corner portions of the trench are rounded, in other words, having a radius of curvature. Such STI corner rounding is advantageous for preventing undesirable electrical behavior such as high electrical fields affecting voltage threshold ($V_T$) in a completed CMOS device, for example.

Following etching of the substrate 2 to form trench 16, a conventional cleaning process using SC-1 and SC-2 cleaning solutions, for example is carried out to clean the substrate surface including exposed portions in the STI trench. In another aspect of the present disclosure, one or more trench liner layers (not shown) are deposited to line the trench opening. For example, in one embodiment, the one or more liner layers include at least one of thermal oxide ($SiO_2$), silicon nitride (e.g., SiN, $Si_3N_4$), and silicon oxynitride (e.g., SiON), including for example, one of an $SiO_2$/SiN, $SiO_2$/SiON, $SiO_2$/SiN/SiON, and $SiO_2$/SiON/SiN stack having a total thickness of about 30 to about 200 Angstroms. For example, in the case of a silicon substrate, a single layer of thermal oxide may be grown by conventional thermal processes over silicon exposed portions of the trench 16 to form a substantially conformal layer of about 30 Angstroms to about 200 Angstroms in thickness. In another embodiment, an LPCVD, PECVD, or ALDCVD process is carried out to blanket deposit a silicon nitride or silicon oxynitride layer over a thermal oxide to form the trench liner layer. In other embodiments, the trench liner layer may be formed of single or multiple layers of SiN and SiON which are deposited without first forming the thermal oxide. However, forming the thermal oxide is preferred in the case a silicon substrate is used, since it tends to better repair any damage caused by etching and to relax thermally induced stresses at the trench surface. In the case the substrate is not silicon, for example GaAs, the oxide layer may be formed by LPCVD or ALCVD over the exposed substrate portions within the STI trench, prior to forming SiN and/or SiON overlayers.

Figure 4:
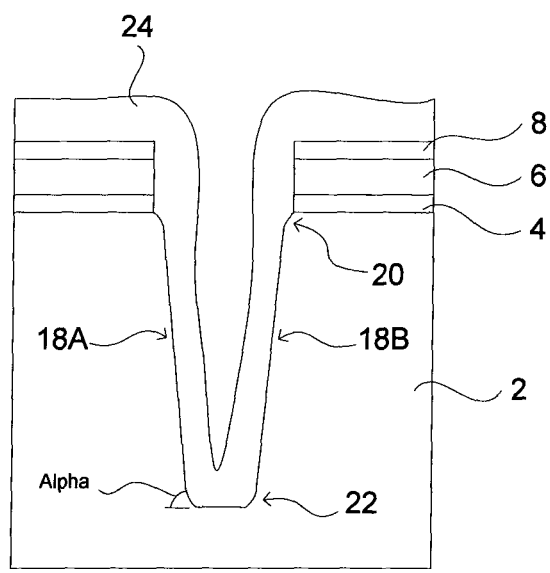

Referring now to FIG. 4, an insulation or oxide layer 24 is blanket deposited to fill the trench 16, the oxide layer 24 lining the surfaces of the first and second sidewalls 18A and 18B, respectively, and the bottom portion of the trench 16. The oxide layer 24 may be a material comprising silicon oxide, silicon dioxide, carbon doped silicon dioxide, nitrogen doped silicon dioxide, germanium doped silicon dioxide, or phosphorus doped silicon dioxide and may be conformally deposited in the trench 16 by atmospheric pressure CVD, low pressure CVD, plasma enhanced CVD, atomic layer deposition, SACVD (sub-atmospheric CVD), HDP (high density plasma CVD), or photo-induced CVD. One skilled in the art understands that other insulation materials may be employed and deposited in trench 16 so long as they serve a purpose of electrically isolating one device region from a neighboring one. Further, other conventional methods for depositing silicon oxide films may also be used as well, as they are understood by those skilled in the art.

In one embodiment of the present disclosure, the oxide layer 24 is deposited by SACVD, at a pressure of from about 100 torr to about 700 torr, at a temperature of from about 400° C. to about 600° C. using a TEOS reaction gas at a flow rate of from about 200 MGM to about 5,000 MGM, an oxygen supply flow rate of from about 10,000 SCCM to about 50,000 SCCM, and an ozone supply rate of from about 10,000 SCCM to about 50,000 SCCM. In some embodiments, the oxide layer 24 is deposited in a gas comprising helium and nitrogen. In another embodiment, the oxide layer 24 is deposited by HDP under the condition of an inactive gas comprising Ar, Ne or He, between a temperature range of from about 350° C. to about 950° C., applying a source RF power of from about 500 W to about 10,000 W, and applying a bias power of from about 500 W to about 10,000 W. Depending on many process factors such as the aspect ratio of the STI trenches and specific device applications with desired film thickness and other physical properties, it is understood that these conditions may and do vary but should not unduly limit the scope of the claims herein.

Figure 5:
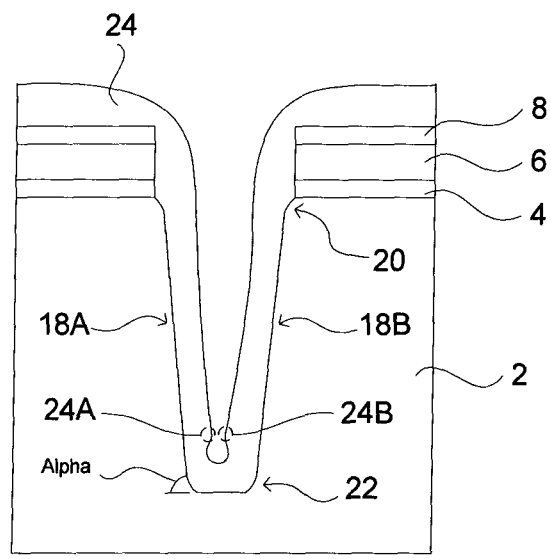

Referring now to FIG. 5, the oxide layer 24 that are deposited near the top portions and the bottom portion of the trench 16 undergo an etch back process. By etching back the insulating material at these areas of the trench and thereafter depositing the insulating material in the trench 16 and by successively repeating the steps of etching back and depositing, protruding parts are formed on either side of the trench sidewalls and these protruding parts thereafter grow to touch each other. The oxide layer 24 formed proximate the top portions and the bottom portion of the trench are etched back by conventional processes known to those skilled in the art. In one embodiment of the present disclosure, the etching back procedure is carried out in a thermal process using an etchant comprising $NF_3$, HF, or $NH_3$, at a temperature range of from about 0° C. to about 950° C. In another embodiment, the etch back is carried out in a plasma enhanced process using an etchant comprising $NF_3$, HF, or $NH_3$, at a temperature range of from about 0° C. to about 950° C., and under an RF power of from about 500 W to about 10,000 W.

Figure 6:
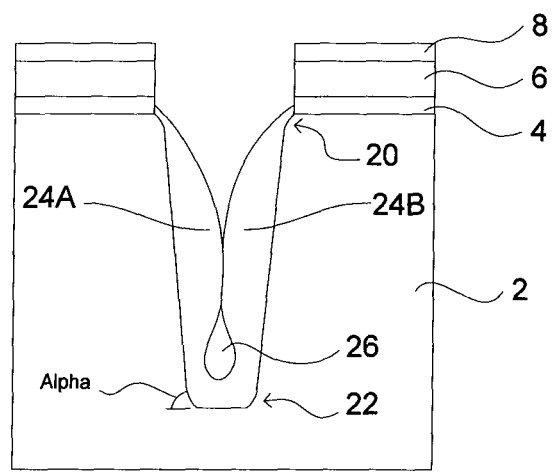

By successively depositing the oxide layer 24 to line the surfaces of the first and second sidewalls 18A and 18B, respectively, and the bottom portion of the trench 16 at a rate that is sufficient to allow a first protruding part 24A deposited on the first sidewall 18A and a second protruding part 24B deposited on the second sidewall 18B to approach thereto-gether and by successively repeating the steps of etching back and deposition, the first protruding part 24A and the second protruding part 24B grow to abut one another, thereby creating a void 26 formed near or proximate the bottom portion of the trench, as illustrated in FIG. 6. The first and second protruding part may be tailored to grow to approach one another by increasing the density of inactive gases and/or by increasing the bias power, according to one embodiment of the present disclosure. Other parameters such as the temperature, pressure, power, type of gas employed, etc. may also be adjusted as is understood to those skilled in the art in order to grow the protruding parts to approach and abut each other at the lower portion of the trench. As the protruding parts are formed on the lower part of the trench 16, so does the void 26 thereof. In one embodiment, the void 26 is formed at a location of less than ⅓ the depth of the trench 16. In another embodiment, the void 26 is formed at a location of less than ¼ the depth of the trench 16. Other deposition and etch back conditions are also contemplated in the present disclosure so long as the other deposition and etch back conditions are capable of having first and second protruding parts 24A and 24B, respectively, approach and abut one another so that a void is formed in the lower part of the trench.

Following the formation of the void 26, a planarization process according to one of a dry etchback and CMP process may be carried out where excess oxide above the trench level, including any hardmask layers above the silicon nitride layer 6, is removed. The silicon nitride layer 6 may be subsequently removed by a conventional wet, e.g., hot H3PO4, etching process or a dry SiN etchback process followed by the removal of the pad oxide layer 4.

The methods of forming bottom void in STI structures according to some embodiments of the present disclosure may be employed in a wide range of applications wherein an isolation region is desired to isolate one device region from a neighboring device region. The method is particularly advantageous in forming substrates having trenches, gaps, etc., with high height to width aspect ratios. Voids formed near the bottom of the trench can have the benefit of good isolation since air has a dielectric constant, k value of only 1.

In the preceding detailed description, the disclosure was described
with reference to exemplary embodiments thereof. It will, however, be evident that various modifications, structures, processes, and changes may be made thereto without departing from the broader spirit and scope of the present invention. The specification and drawings are, accordingly, to be regarded as illustrative and not restrictive. It is understood that embodiments of the present disclosure are capable of using various other combinations and environments and are capable of changes or modifications within the scope of the invention as expressed herein.

What is claimed is:
1. A method for forming a shallow trench isolation (STI) structure, comprising:
(a) providing a semiconductor substrate;
(b) forming a trench in the substrate, the trench having a first sidewall and a second sidewall opposite the first sidewall, the first and second sidewalls extending down to a bottom portion of the trench;
(c) depositing an insulating material to conformally line surfaces of the first and second sidewalls and the bottom portion of the trench;
(d) etching back the insulating material proximate the top portions of the trench and the bottom portion of the trench;
(e) depositing successively the insulating material to line the surfaces of the first and the second sidewalls and the bottom portion of the trench at a rate that is sufficient to allow a first protruding insulating material deposited on the first sidewall and a second protruding insulating material deposited on the second sidewall to approach theretogether;
(f) repeating steps (d) and (e) to have the first protruding insulating material and the second protruding insulating material abut, thereby forming a void proximate the bottom portion of the trench.

2. The method of claim 1, wherein the insulating material comprises at least one of silicon oxide, silicon dioxide, carbon doped silicon dioxide, nitrogen doped silicon dioxide, germanium doped silicon dioxide or phosphorus doped silicon dioxide.

3. The method of claim 1, wherein the insulating material is deposited by at least one of atmospheric pressure CVD, low pressure CVD, plasma enhanced CVD, atomic layer deposition, SACVD (sub-atmospheric CVD), HDP (high density plasma CVD), or photo-induced CVD.

4. The method of claim 1, wherein the insulating material is deposited by sub-atmospheric CVD.

5. The method of claim 4, wherein the insulating material is deposited at a pressure of between about 100 torr and about 700 torr, at a temperature of between about 400° C. and about 600° C. using a TEOS reaction gas at a flow rate of between about 200 MGM and about 5,000 MGM, an oxygen supply flow rate of between about 10,000 SCCM and about 50,000 SCCM, and an ozone supply rate of between about 10,000 SCCM and about 50,000 SCCM.

6. The method of claim 4, wherein the insulating material is deposited in a gas comprising at least one of helium or nitrogen.

7. The method of claim 1, wherein the insulating material is deposited by high density plasma CVD.

8. The method of claim 7, wherein the insulating material is deposited by increasing a density of inactive gases or bias power to form the void.

9. The method of claim 8, wherein the insulating material is deposited under the condition of an inactive gas comprising Ar, Ne or He, between a temperature range of between about 350° C. and about 950° C., applying a source RF power of between about 500 W and about 10,000 W, and applying a bias power of between about 500 W and about 10,000 W.

10. The method of claim 1, wherein the step of etching back is carried out in a thermal process using an etchant comprising at least one of $NF_3$, HF, or $NH_3$, in a temperature range of between about 0° C. and about 950° C.

11. The method of claim 1, wherein the step of etching back is carried out in a plasma enhanced process using an etchant comprising at least one of $NF_3$, HF, or $NH_3$, in a temperature range of between about 0° C. and about 950° C., and under an RF power of between about 500 W and about 10,000 W.

12. The method of claim 1, wherein the step of forming the trench comprises forming a trench having at least one of rounded top corners or rounded bottom corners.

13. The method of claim 1, further comprising forming a patterned pad oxide layer over the substrate and forming a patterned hard mask layer comprising a material selected from the group consisting of silicon nitride, $C_xH_y$, and silicon oxynitride over the oxide layer.

14. The method of claim 13, further comprising:
removing the insulating material to a level of the patterned hard mask layer;
removing the patterned hard mask layer; and
removing the patterned pad oxide layer.

15. The method of claim 1, wherein the void is formed at a location of less than ⅓ a depth of the trench.

16. The method of claim 1, wherein the void is formed at a location of less than ¼ a depth of the trench.

17. The method of claim 1,
wherein the void is formed at a location of less than ⅓ a depth of the trench.

18. The method of claim 1, wherein forming the trench in the substrate comprises:
forming the first sidewall as a sloped sidewall, wherein an angle of the sloped sidewall with respect to a plane of the substrate is between about 80 degrees and 89 degrees.

19. The method of claim 1, further comprising
planarizing a top surface of the semiconductor substrate.

20. The method of claim 1, wherein depositing the insulating material comprises depositing an insulating material having a thickness of about 30 Angstroms to about 200 Angstroms.

* * * * *